US007777239B2

(12) United States Patent
Wu

(10) Patent No.: US 7,777,239 B2
(45) Date of Patent: Aug. 17, 2010

(54) MULTI-WAVELENGTH LIGHT-EMITTING MODULE WITH HIGH DENSITY ELECTRICAL CONNECTIONS

(75) Inventor: Ming-Che Wu, Chiayi (TW)

(73) Assignee: Universal Scientific Industrial Co., Ltd., Nan-Tou (TW)

( * ) Notice: Subject to any disclaimer, the term of this patent is extended or adjusted under 35 U.S.C. 154(b) by 196 days.

(21) Appl. No.: 12/078,692

(22) Filed: Apr. 4, 2008

(65) Prior Publication Data

US 2009/0166648 A1 Jul. 2, 2009

(30) Foreign Application Priority Data

Dec. 31, 2007 (TW) .............................. 96151529 A

(51) Int. Cl.
*H01L 33/00* (2010.01)

(52) U.S. Cl. .............................. 257/89; 438/22; 438/69

(58) Field of Classification Search ................... 257/80, 257/84, 89, E33.001, E33.058; 438/22, 28, 438/69, 70
See application file for complete search history.

(56) References Cited

U.S. PATENT DOCUMENTS

| | | | | |
|---|---|---|---|---|
| 7,462,502 | B2 * | 12/2008 | Paolini et al. | 438/22 |
| 2009/0079943 | A1 * | 3/2009 | Wu | 353/31 |
| 2009/0114931 | A1 * | 5/2009 | Hsueh et al. | 257/89 |
| 2009/0166647 | A1 * | 7/2009 | Wu | 257/89 |

FOREIGN PATENT DOCUMENTS

| | | |
|---|---|---|
| JP | 05-211666 | 8/1993 |
| JP | 05-278260 | 10/1993 |

* cited by examiner

*Primary Examiner*—Phuc T Dang
(74) *Attorney, Agent, or Firm*—Kile Goekjian Reed & McManus

(57) ABSTRACT

A multi-wavelength light-emitting module with high density electrical connections includes a drive IC structure and a multi-wavelength LED array structure. The drive IC structure has a drive IC unit formed on a top surface thereof. The multi-wavelength LED array structure is disposed on the top surface of the drive IC structure, and the multi-wavelength LED array structure has a conductive trace unit formed on an outer surface thereof and electrically connected to the drive IC unit.

5 Claims, 5 Drawing Sheets

MULTI-WAVELENGTH LIGHT-EMITTING MODULE WITH HIGH DENSITY ELECTRICAL CONNECTIONS

BACKGROUND OF THE INVENTION

1. Field of the Invention

The present invention relates to a multi-wavelength light-emitting module, and particularly relates to a multi-wavelength light-emitting module with high density electrical connections.

2. Description of the Related Art

As a method for forming a color photograph or a color print, there is a method for forming an image, such as a picture or a character, on a photosensitive sheet by exposing the sheet. There are different types of photosensitive sheets, for example, a photosensitive sheet employing a multi-layer color development method, in which three layers of photosensitive emulsions with different color sensitivities are layered on a single supportive sheet thus forming a photosensitive member, a photosensitive sheet that employs a film in which each emulsion layer contains a pigment and a developing agent so that the film is capable of being exposed and developed simultaneously, and the like.

A still another photosensitive sheet called Cycolor medium, as shown in FIG. 1, which employs, as a photosensitive material, microcapsules (cyliths) (3*a*, 3*b*, 3*c*) that contain different chromogenic substances and different photoinitiators. In the Cycolor medium la, a thin supportive body 2 formed from, for example, polyester, is coated with a photosensitive material layer 4 containing numerous cyliths of a very small size. When exposed to light, cyliths harden so that only the cyliths of a specific color are activated, and the cyliths are ruptured by pressurization, and then developed, thereby forming an image of a predetermined color. Other photosensitive sheets have different color development principles, but need to be exposed to exposure light of the color of an image or its complementary color to form an image.

In widely used methods for exposing a photosensitive sheet, white light is split into three primary colors by a filter or the like, and images are formed using the individual primary colors, and then combined to form an image of predetermined colors or an image of their complementary colors on the photosensitive.

Another technology has recently been developed, as disclosed in Japanese patent application laid-open Nos. Hei 5-211666 and Hei 5-278260, in which LEDs or lasers that emit red light, green light and blue light are employed as light-emitting sources, and the light-emitting sources are controlled so that. an image of predetermined colors is formed on a photosensitive sheet and the sheet is thereby exposed.

However, in an exposure apparatus employing LEDs or lasers as light sources as disclosed in Japanese patent application laid-open Nos. Hei 5-211666 and Hei 5-278260, a lens system is employed to converge light emitted from the LEDs or lasers onto a medium. To control colors in the unit of dots, it is necessary to employ expensive optical systems that require a large installation space, such as a scanning optical system, a micro-lens array, and the like. The micro-lens array and lens groups constituting the scanning optical system have a loss in light transmission, so that only a portion of the light emitted from the LED or laser light sources reaches the photosensitive sheet (medium). Therefore, in some cases, LEDs are not sufficient to provide an amount of light required for exposure of a photosensitive sheet. In other cases, the printing rate must be reduced and the printing time must be increases in order to secure a sufficiently long exposure duration. In addition, an optical system employing lenses requires a large installation space, and is costly, so that a printing apparatus becomes large and costly.

SUMMARY OF THE INVENTION

One particular aspect of the present invention is to provide a package structure module with high density electrical connections. The package structure module is an LED (Light Emitting Diode) array structure module, and the LED array structure module is a light exposure module that can be applied to an EPG (Electrophotography) printer.

The features of the present invention include (1) forming drive IC pads on the top surface of a drive IC structure, forming LED conductive traces on the top surface of each single wavelength LED array, and forming LED pads on the two sides of each single wavelength LED array; (2) arranging the single wavelength LED arrays on the drive IC structure in order to respectively electrically connected the LED dies of each single wavelength LED array with the drive IC pads via the LED conductive traces and the LED pads in series. Therefore, the present invention can reduce product size, material cost, and manufacturing cost due to high density electrical connection.

In order to achieve the above-mentioned aspects, the present invention provides a multi-wavelength light-emitting module with high density electrical connections, including: a drive IC structure and a multi-wavelength LED array structure. The drive IC structure has a drive IC unit formed on a top surface thereof. The multi-wavelength LED array structure is disposed on the top surface of the drive IC structure, and the multi-wavelength LED array structure has a conductive trace unit formed on an outer surface thereof and electrically connected to the drive IC unit.

Therefore, the present invention does not need to use a wire-bonding process as in the prior art that requires a long time. Hence, the present invention not only can reduce product size, material cost, and manufacturing cost, but also increases production speed.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 1:
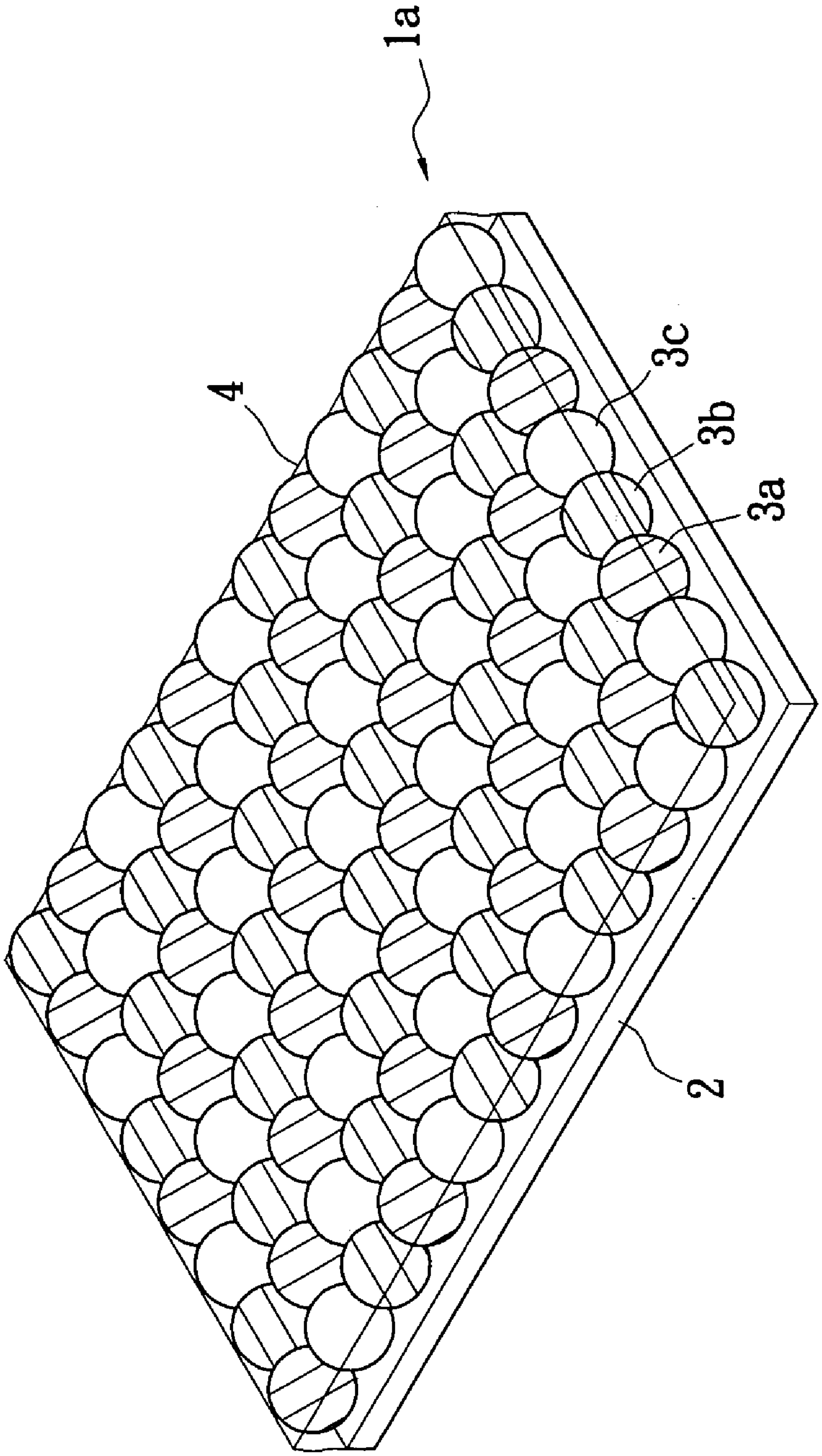
FIG. 1 PRIOR ART
FIG. 1 is a perspective, schematic view of a Cycolor medium in an enlarge view according to the prior art.
Figure 2:
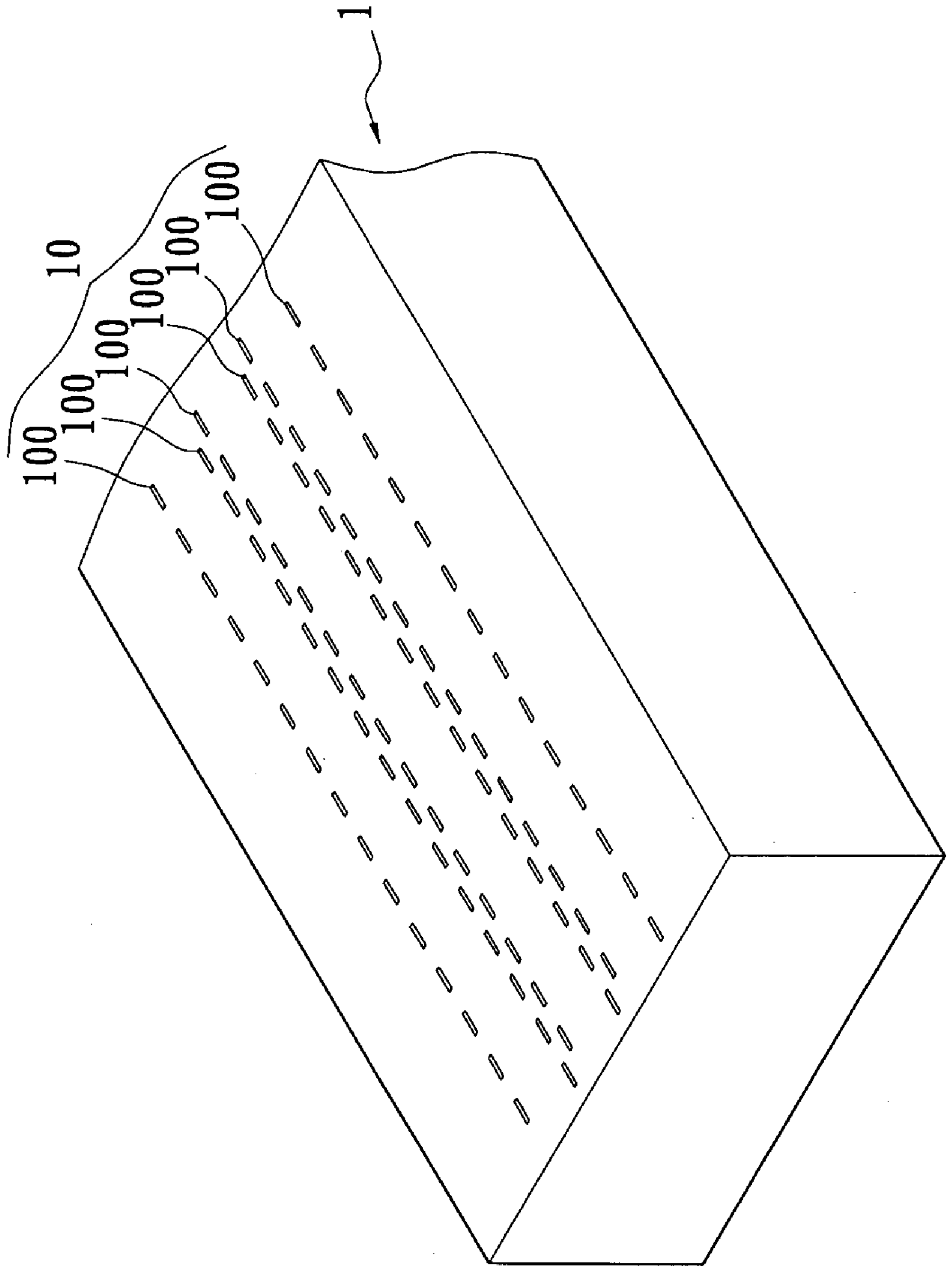
FIG. 2 is a perspective, schematic view of a driver IC structure of a multi-wavelength light-emitting module with high density electrical connections according to the present invention.
Figure 3:
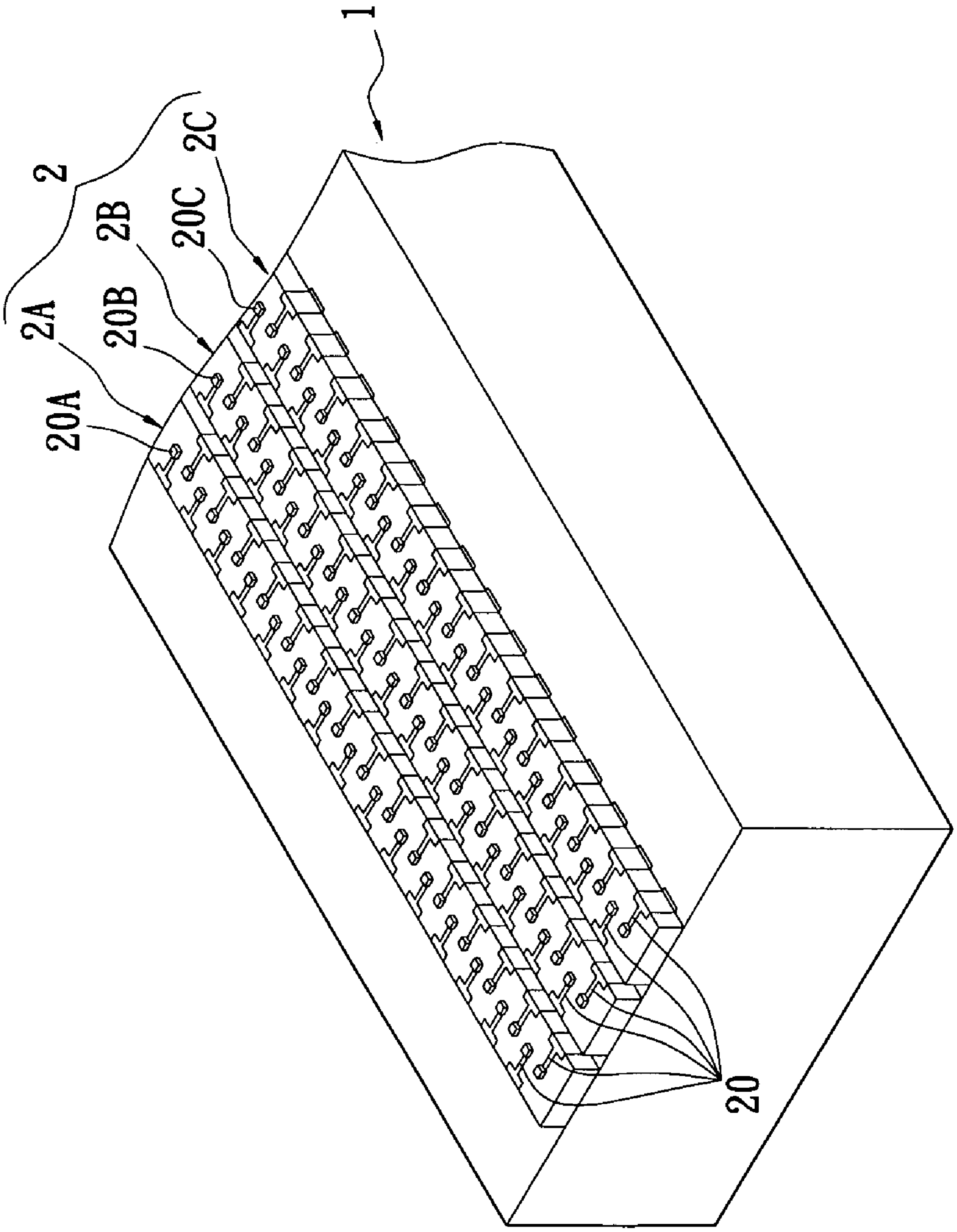
FIG. 3 is a perspective, schematic view of a multi-wavelength light-emitting module with high density electrical connections according to the present invention.
Figure 4:
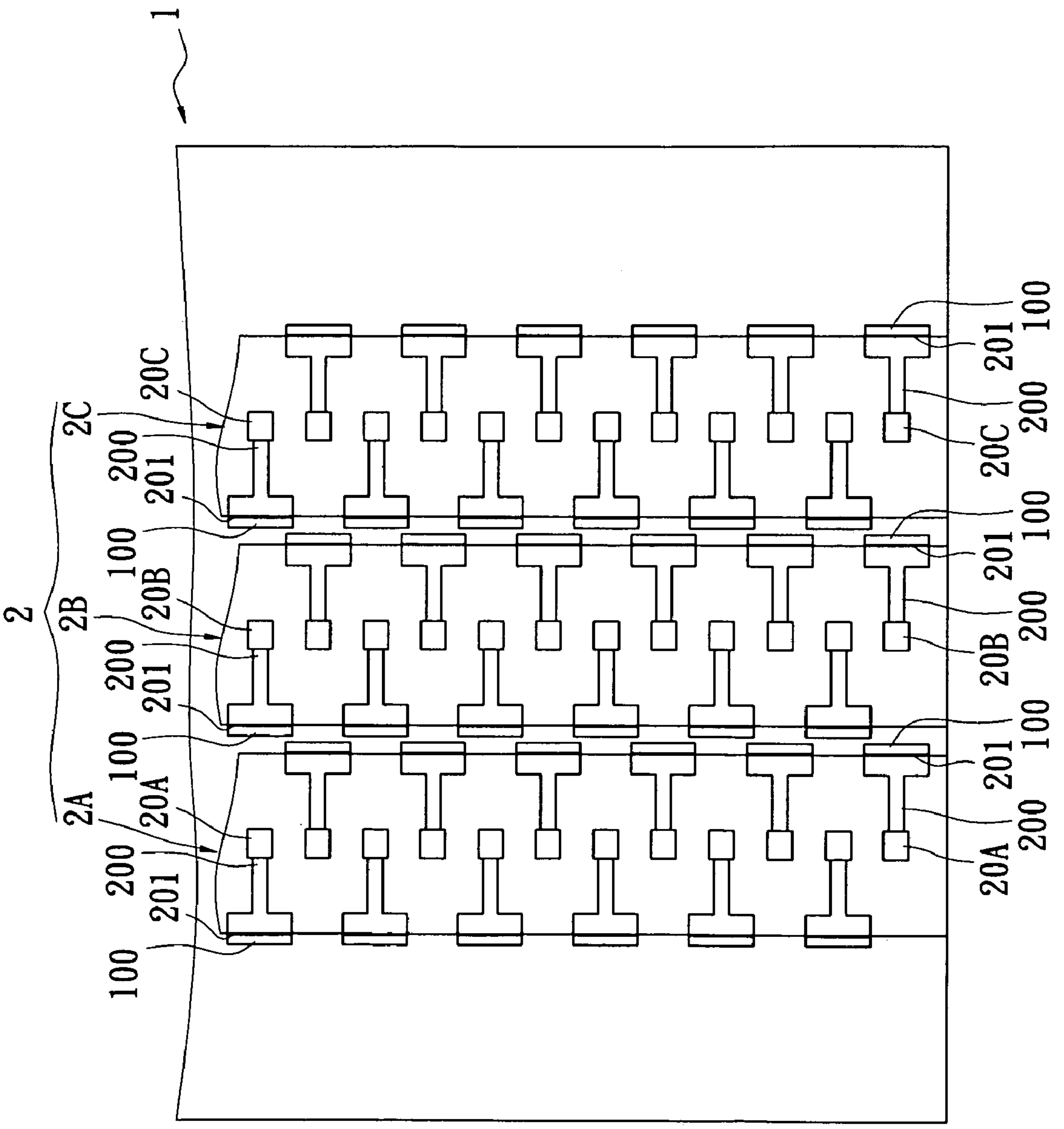
FIG. 4 is a top, schematic view of a multi-wavelength light-emitting module with high density electrical connections according to the present invention.
Figure 5:
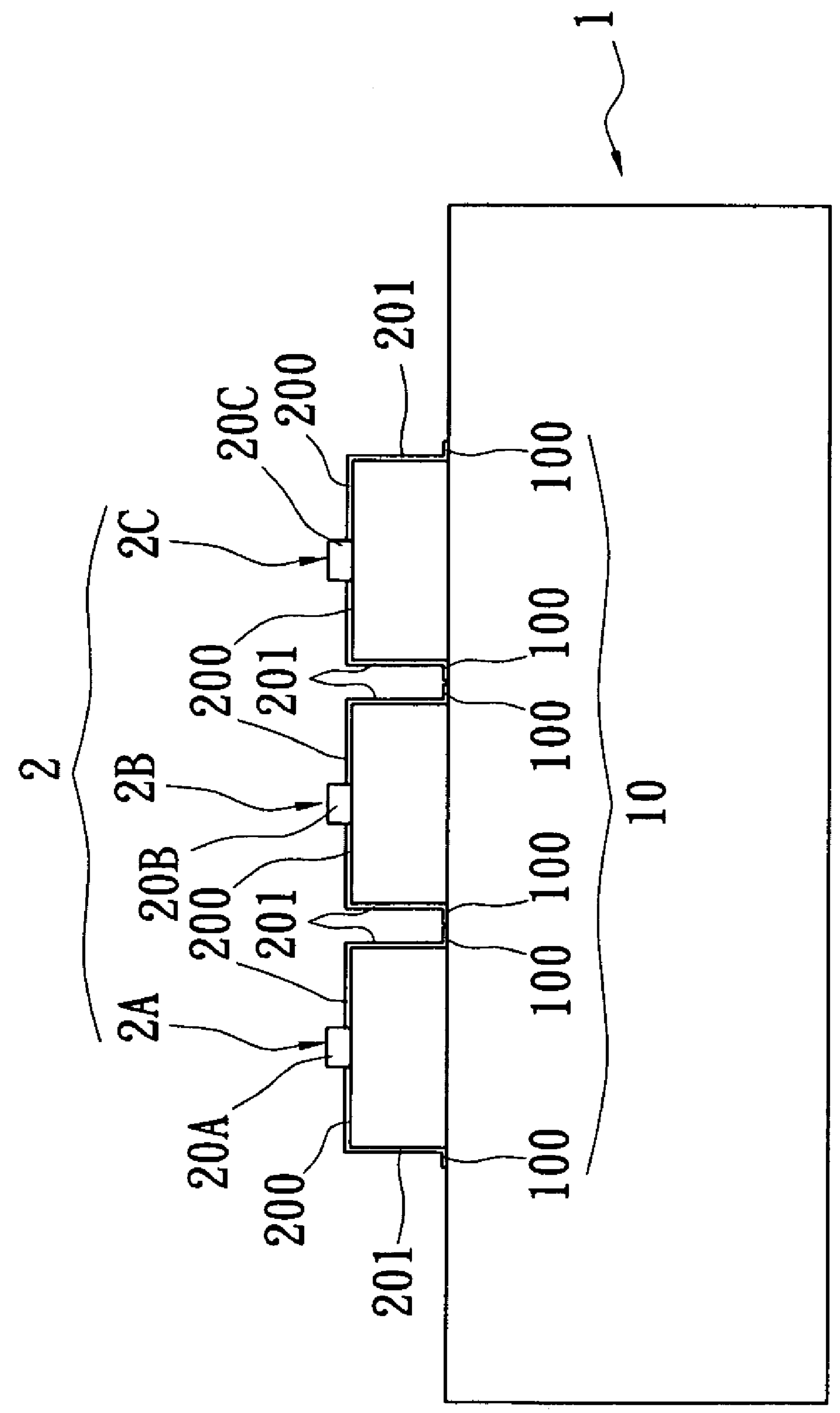
FIG. 5 is a side, schematic view of a multi-wavelength light-emitting module with high density electrical connections according to the present invention.

Referring to FIGS. 2 to 5, the present invention provides a multi-wavelength light-emitting module with high density electrical connections, including: a drive IC structure 1 and a multi-wavelength LED array structure 2.

The drive IC structure 1 has a drive IC unit 10 formed on a top surface thereof, and the drive IC unit 10 has a plurality of drive IC pads 100 that are divided into six rows of drive IC pads 100.

Moreover, the multi-wavelength LED array structure 2 is disposed on the top surface of the drive IC structure 1. The multi-wavelength LED array structure 2 is composed of three single wavelength LED arrays (2A, 2B, 2C) that have different emission wavelengths. Each single wavelength LED (2A, 2B, 2C) has a plurality of LED dies (20A, 20B, 20C) with the same wavelength.

Furthermore, the multi-wavelength LED array structure 2 has a conductive trace unit 20 formed on an outer surface thereof and electrically connected to the drive IC unit 10. The conductive trace unit 20 includes a plurality of LED conductive traces 200 respectively formed on top surfaces of the single wavelength LED arrays (2A, 2B, 2C) and a plurality of LED pads 201 respectively formed on two sides of each single wavelength LED array (2A, 2B, 2C). Hence, the LED dies (20A, 20B, 20C) are respectively electrically connected to the drive IC pads 100 via the conductive trace unit 20 of the multi-wavelength LED array structure 2.

In other words, in the present embodiment one part of LED dies 20A of the single wavelength LED array 2A is connected to the first row (left-most side) of drive IC pads 100 via the LED conductive traces 200 and the LED pads 201. The LED conductive traces 200 are formed on the top surface of the single wavelength LED array 2A, and the LED pads 201 are formed on the left side surface of the single wavelength LED array 2A. In addition, the other part of LED dies 20A of the single wavelength LED array 2A is connected to the second row of drive IC pads 100 via the LED conductive traces 200 and the LED pads 201. The LED conductive traces 200 are formed on the top surface of the single wavelength LED array 2A, and the LED pads 201 are formed on the right side surface of the single wavelength LED array 2A.

Moreover, one part of LED dies 20B of the single wavelength LED array 2B is connected to the third row of drive IC pads 100 via the LED conductive traces 200 and the LED pads 201. The LED conductive traces 200 are formed on the top surface of the single wavelength LED array 2B, and the LED pads 201 are formed on the left side surface of the single wavelength LED array 2B. In addition, the other part of LED dies 20B of the single wavelength LED array 2B is connected to the fourth row of drive IC pads 100 via the LED conductive traces 200 and the LED pads 201. The LED conductive traces 200 are formed on the top surface of the single wavelength LED array 2B, and the LED pads 201 are formed on the right side surface of the single wavelength LED array 2B.

Furthermore, one part of LED dies 20C of the single wavelength LED array 2C is connected to the fifth row of drive IC pads 100 via the LED conductive traces 200 and the LED pads 201. The LED conductive traces 200 are formed on the top surface of the single wavelength LED array 2C, and the LED pads 201 are formed on the left side surface of the single wavelength LED array 2C. In addition, the other part of LED dies 20C of the single wavelength LED array 2C is connected to the sixth row (the right-most side) of drive IC pads 100 via the LED conductive traces 200 and the LED pads 201. The LED conductive traces 200 are formed on the top surface of the single wavelength LED array 2C, and the LED pads 201 are formed on the right side surface of the single wavelength LED array 2C.

Therefore, the LED dies (20A, 20B, 20C) are respectively electrically connected to the drive IC pads 100 via the LED conductive traces 200 and the LED pads 201 in series.

However, above-mentioned three single wavelength LED arrays (2A, 2B, 2C) do not used to limit the present invention. One or more single wavelength LED arrays each having a plurality of LED pads formed on two sides thereof can be applied to the present invention. In conclusion, the package structure module is an LED (Light Emitting Diode) array structure module, and the LED array structure module is a light exposure module that can be applied to an EPG (Electrophotography) printer.

The features of the present invention include (1) forming drive IC pads on the top surface of a drive IC structure, forming LED conductive traces on the top surface of each single wavelength LED array, and forming LED pads on the two sides of each single wavelength LED array; (2) arranging the single wavelength LED arrays on the drive IC structure in order to respectively electrically connected the LED dies of each single wavelength LED array with the drive IC pads via the LED conductive traces and the LED pads in series. Therefore, the present invention can reduce product size, material cost, and manufacturing cost due to high density electrical connection.

Hence, the present invention does not need to use a wire-bonding process as in the prior art that requires a long time. Hence, the present invention not only can reduce product size, material cost, and manufacturing cost, but also increases production speed.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A multi-wavelength light-emitting module with high density electrical connections, comprising:

a drive IC structure having a drive IC unit formed on a top surface thereof; and a multi-wavelength LED array structure having an upper surface disposed above the top surface of the drive IC structure and vertically separated from said top surface of said drive IC structure, wherein the multi-wavelength LED array structure has a conductive trace unit extending at said upper surface of said multi-wavelength LED array structure and along two opposite lateral walls of said multi-wavelength LED structure for being electrically connected to the drive IC unit, and wherein said lateral walls connect said top surface of said drive IC structure and said upper surface of said multi-wavelength LED array structure.

2. The multi-wavelength light-emitting module as claimed in claim 1, wherein the drive IC unit has a plurality of drive IC pads, and the multi-wavelength LED array structure has a plurality of LED dies electrically connected to the drive IC pads, respectively.

3. The multi-wavelength light-emitting module as claimed in claim 1, wherein the drive IC unit has a plurality of drive IC pads, the multi-wavelength LED array structure has a plurality of single wavelength LED arrays, and each single wavelength LED has a plurality of LED dies with the same wavelength.

4. The multi-wavelength light-emitting module as claimed in claim 3, wherein the conductive trace unit includes a plurality of LED conductive traces respectively formed on upper surfaces of the single wavelength LED arrays and a plurality of LED pads respectively formed on two sides of each single wavelength LED array, and wherein the LED dies are respectively electrically connected to the drive IC pads via the LED conductive traces and the LED pads in series.

5. A multi-wavelength light-emitting module with high density electrical connections, comprising:

a drive IC structure having a drive IC unit formed on a top surface thereof, said drive IC unit having a plurality of drive IC pads; and a multi-wavelength LED array structure disposed on the top surface of the drive IC structure, wherein the multi-wavelength LED array structure has a plurality of single wavelength LED arrays, each single wavelength LED including a plurality of LED dies generating light of the same wavelength, wherein the multi-wavelength LED array structure has a conductive trace unit formed on an upper surface thereof and electrically connected to the drive IC unit, said conductive trace unit including a plurality of LED conductive traces formed on top surfaces of the single wavelength LED arrays and a plurality of LED pads formed at two opposite sides of each single wavelength LED array, and wherein the LED dies are electrically connected to respective drive IC pads via the LED conductive traces and the LED pads in series.

* * * * *